(12) United States Patent
Song

(10) Patent No.: US 6,359,499 B1
(45) Date of Patent: Mar. 19, 2002

(54) TEMPERATURE AND PROCESS INDEPENDENT CMOS CIRCUIT

(75) Inventor: Yonghua Song, Saratoga, CA (US)

(73) Assignee: Marvell International Ltd., Hamilton (BM)

(*) Notice: Subject to any disclaimer, the term of this patent is extended or adjusted under 35 U.S.C. 154(b) by 0 days.

(21) Appl. No.: 09/599,907

(22) Filed: Jun. 23, 2000

(51) Int. Cl.$^7$ .................. H01L 35/00; H01L 37/00; H03K 3/42; H03K 17/78
(52) U.S. Cl. .................. 327/513; 327/359
(58) Field of Search .................. 327/513, 355, 327/356, 359

(56) References Cited

U.S. PATENT DOCUMENTS

| | | | |
|---|---|---|---|
| 5,097,156 A | 3/1992 | Shimabukuro et al. | 307/491 |
| 5,157,350 A | 10/1992 | Rubens | 330/254 |
| 5,180,994 A * | 1/1993 | Martin et al. | 331/38 |
| 5,327,029 A | 7/1994 | Ericson et al. | 307/491 |
| 5,521,544 A | 5/1996 | Hatanaka | 327/356 |
| 5,966,040 A | 10/1999 | Gai et al. | 327/357 |
| 5,986,494 A | 11/1999 | Kimura | 327/359 |
| 6,018,269 A * | 1/2000 | Viswanathan | 330/254 |
| 6,242,963 B1 * | 6/2001 | Su et al. | 327/359 |

* cited by examiner

Primary Examiner—Terry D. Cunningham
Assistant Examiner—Quan Tra
(74) Attorney, Agent, or Firm—Eric B. Janofsky (57) ABSTRACT

A analog function is constructed based on CMOS (complimentary metal-oxide semiconductor) technology. It is capable of providing an output voltage, which is proportional to the product of two input voltages. This analog function is insensitive to temperature and process variations by using a PMOS device as a load device for an NMOS analog function. The PMOS characteristics are used cancel or balance the variations in process and temperature in the other NMOS devices. To further control the function of the loading devices a loading device controller within the analog function compensates for changes in voltage level of the output signal due to variations in temperature and variations in manufacturing process within the function core circuit. The loading device controller has a loading control voltage terminal to provide the loading control voltage to provide temperature and process compensating biasing voltage for the load devices.

44 Claims, 5 Drawing Sheets

TEMPERATURE AND PROCESS INDEPENDENT CMOS CIRCUIT

BACKGROUND OF THE INVENTION

1. Field of the Invention

This invention relates to analog circuits such as multipliers, adaptive filters, function generators, modulators, and neural networks. More particularly, this invention relates to compensation circuits incorporated with analog circuits to offset deviation in operation of the analog circuit due to variations in temperature and process.

2. Description of Related Art

Figure 1:
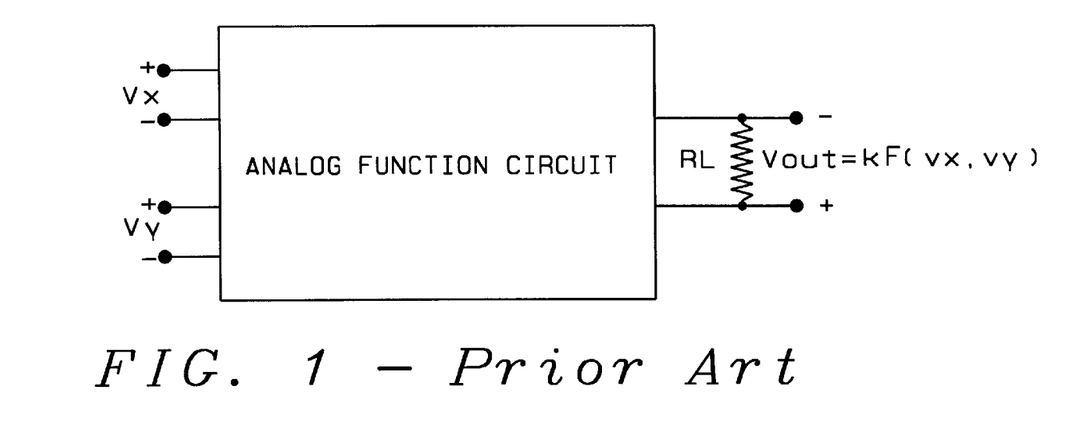
FIGS. 1 and 2 are system block diagrams of a two-input voltage multiplier of the prior art.

Analog function circuits such as multipliers, adaptive filters, function generators, modulators, and neural networks, as is known in the art, produce a voltage output, which is proportional to an arithmetic function of two voltage inputs. As semiconductor processing has improved, more and varied circuits are formed on a semiconductor substrate. This has mandated the creation of libraries of analog function circuits or analog function cores. FIG. 1 shows a system diagram of an analog function core. There are two differential voltage inputs vx, vy, and one differential voltage output vout. A load resistor RL is connected between the inverted and non-inverted output the differential voltage output vout. The differential output voltage vout is developed across a load resistor, RL and is determined by the formula:

$$\text{vout}=kF(v_x v_y) \qquad \text{EQ. 1}$$

where:

k is a constant of proportionality or scaling factor.

F is the arithmetic function to be performed on the two differential input signals vx and vy.

Figure 2:
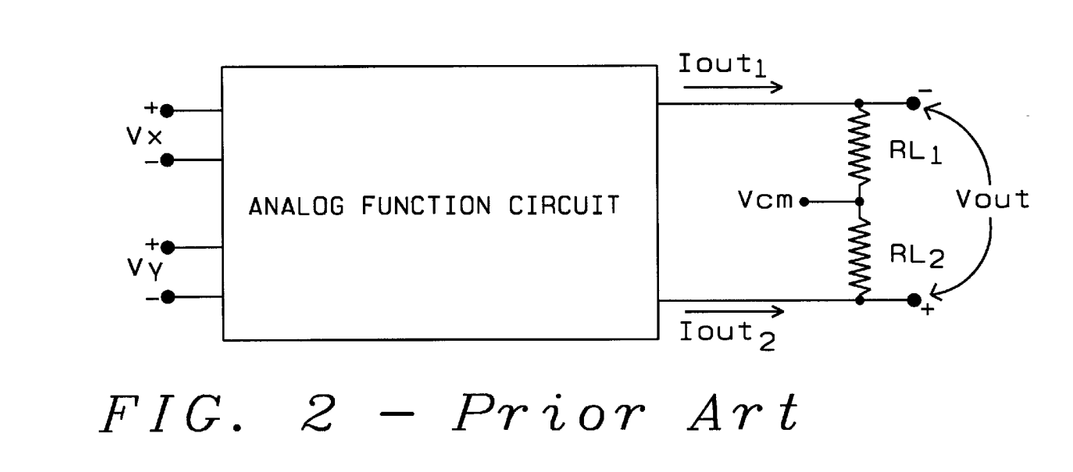

The load resistor RL of FIG. 1 can be formed of the two load resistors RL1 and RL2 as shown in FIG. 2. The load resistor RL1 is connected between the inverting output (−) of the differential output voltage vout and the common mode biasing voltage source Vcm. The load resistor RL2 is connected between the non-inverting output (+) of the differential output voltage vout and the common mode biasing voltage source Vcm.

The voltage level present at the inverted (−) output terminal of the differential output vout is determined as:

vout−=Iout1*RL1+Vcm where:

$I_{out1}$ is the output current and is determined as a function of the two differential input signals vx and vy.

RL1 is the resistance value of the load resistor. Conversely, the voltage level present at the non-inverted (+) output terminal of the differential output vout is determined as:

vout+=Iout2*RL2+Vcm where:

$I_{out2}$ is the output current and is determined as a function of the two differential input signals vx and vy.

RL2 is the resistance value of the load resistor.

Figure 3:
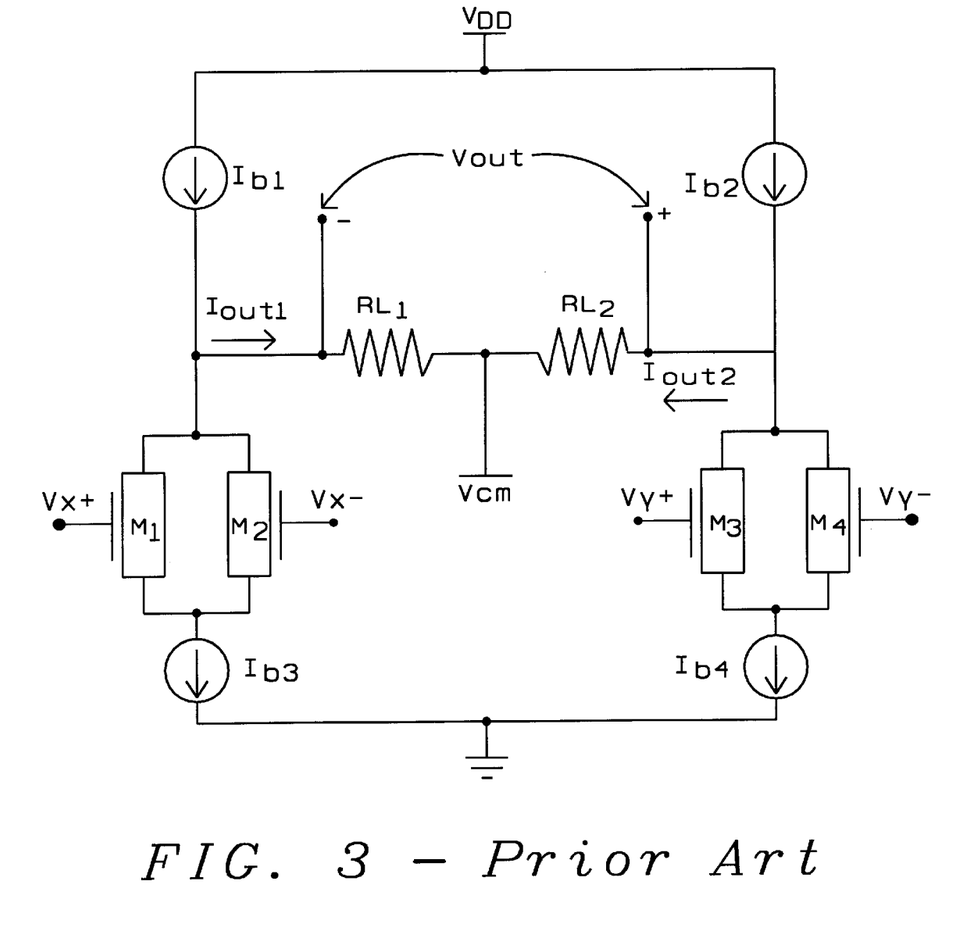
FIG. 3 is a schematic of an analog multiplier of the prior art.

FIG. 3 shows an example of an analog function circuit implemented as a voltage multiplier with differential voltage inputs and a voltage output across a load resistor. The non-inverting input vx+ of the first differential voltage input vx is connected to the gate of one of the n-type metal oxide semiconductor (MOS) transistors M1 of a parallel connected pair of n-type MOS transistors M1 and M2. The gate of the second n-type MOS transistor M2 of the parallel connected pair of n-type MOS transistors M1 and M2 is connected to the inverting input vx− of the first differential voltage input vx. The commonly connected sources of the parallel connected pair of n-type MOS transistors M1 and M2 are connected to a first terminal of a current source Ib3. The second terminal of the current source Ib3 is connected to a ground reference point. The commonly connected drains of the parallel connected pair of n-type MOS transistors M1 and M2 are connected to a first terminal of a current source Ib1. The second terminal of the current source Ib1 is connected to a power supply voltage source $V_{DD}$. The junction of the commonly connected drains of the parallel connected pair of n-type MOS transistors M1 and M2 and the first terminal of a current source Ib3 form the output terminal containing the inverted output (−) of the differential output voltage vout.

The non-inverting input vy+ of the first differential voltage input vy is connected to the gate of one of the n-type metal oxide semiconductor (MOS) transistors M3 of a parallel connected pair of n-type MOS transistors M3 and M4. The gate of the second n-type MOS transistor M4 of the parallel connected pair of n-type MOS transistors M3 and M4 is connected to the inverting input vy− of the second differential voltage input vy. The commonly connected sources of the parallel connected pair of n-type MOS transistors M3 and M4 are connected to a first terminal of a current source Ib4. The second terminal of the current source Ib4 is connected to a ground reference point. The commonly connected drains of the parallel connected pair of n-type MOS transistors M3 and M4 are connected to a first terminal of a current source Ib2. The second terminal of the current source Ib2 is connected to a power supply voltage source $V_{DD}$. The junction of the commonly connected drains of the parallel connected pair of n-type MOS transistors M3 and M4 and the first terminal of a current source Ib2 form output terminal containing the non-inverted output (+) of the differential output voltage vout.

The load resistor RL1 is connected between the inverting output (−) of the differential output voltage vout and the common mode biasing voltage source Vcm. The load resistor RL2 is connected between the non-inverting output (+) of the differential output voltage vout and the common mode biasing voltage source Vcm.

The gates of the parallel connected pair of n-type MOS transistors M1 and M2 and the gates of the parallel connected pair of n-type MOS transistors M3 and M4 are biased externally with a constant voltage source VB (not shown) to cause the parallel connected pair of n-type MOS transistors M1 and M2 and the parallel connected pair of n-type MOS transistors M3 and M4 to operate in the saturation region. This insures that any voltage developed from the drains to the sources of the parallel connected pair of n-type MOS transistors M1 and M2 or the parallel connected pair of n-type MOS transistors M3 and M4 does not effect the saturation drain-to-source current Ids through the parallel connected pair of n-type MOS transistors M1 and M2 or the parallel connected pair of n-type MOS transistors M3 and M4.

The drain-to-source saturation current $Ids_{sat}$ of each of the parallel connected pair of n-type MOS transistors M1 and M2 or the parallel connected pair of n-type MOS transistors M3 and M4 is found by the formula:

$$Ids_{sat}=K(V_{GS}-V_T)^2$$

where:

VGS is the gate-to-source of each MOS transistor.

VT is the threshold voltage at which MOS transistor begins to conduct or turn-on.

K is a process constant found as the function $$K = \mu_s \left(\frac{C_{ox}}{2}\right)\left(\frac{W}{L}\right)$$

where:

$\mu_s$ is the mobility of the bulk doped semiconductor material that forms the channel.

$C_{ox}$ is the capacitance of the gate oxide of the MOS transistors.

$\left(\frac{W}{L}\right)$ is the width-to-length ratio of the MOS transistors.

As can be shown from Einstein's Relationship, the mobility $\mu_s$ of the semiconductor material is dependent upon the absolute temperature of operation. Further, any changes in the process that effects the doping of the semiconductor material will further change the value of the mobility $\mu_s$ of the semiconductor material. Additionally, process changes may effect the geometric values of the width-to-length ratio $\left(\frac{W}{L}\right)$, as well as the thickness of the insulating material that forms the gate oxide, which will change the values of the capacitance $C_{ox}$.

It can be shown that the output currents $I_{out1}$ and $I_{out2}$ can be calculated by the formula:

$$I_{out1} = I_{out2} = \mu_n (C_{ox}) \left(\frac{W}{L}\right) * v_x * v_y$$

where:

$\mu_n$ is the mobility of the bulk doped semiconductor material that forms the channel.

$C_{ox}$ is the capacitance of the gate oxide of the parallel connected pair of n-type MOS transistors M1 and M2 and the parallel connected pair of n-type MOS transistors M3 and M4.

$\left(\frac{W}{L}\right)$ is the width-to-length ratio of the parallel connected pair of n-type MOS transistors M1 and M2 and the parallel connected pair of n-type MOS transistors M3 and M4.

Thus, the voltage level present at the inverted (−) output terminal of the differential output vout is determined as:

$$Vout \mathrel{+}= I_{out1} * RL1 = \mu_n C_{ox} \left(\frac{W}{L}\right) * v_x * v_y * RL1 \qquad \text{Eq. 3}$$

and the voltage level present at the non-inverted (+) output terminal of the differential output vout is determined as:

$$Vout \mathrel{-}= I_{out2} * RL2 = \mu_n C_{ox} \left(\frac{W}{L}\right) * v_x * v_y * RL2. \qquad \text{Eq. 4}$$

BRIEF SUMMARY OF THE INVENTION

An object of this invention is to provide an analog integrated circuit such as a multiplier, adaptive filter, function generator, modulator, or neural network whose output voltage signal is independent from variations in temperature and process.

Another object of this invention is to provide a compensation circuit in connection with or integrated with an analog circuit such as a multiplier, adaptive filter, function generator, modulator, or neural network to make the output signal of the analog circuit not vary with changes in temperature and manufacturing process.

To accomplish these and other objects a temperature and process independent analog integrated circuit has an analog integrated function core circuit. The function core circuit has a first differential pair of input terminals to receive a first input signal, a second differential pair of input terminals to receive a second input signal, and a differential pair of output terminals. The differential pair of output terminals contains an output signal that is a function of a scaling constant, the first input signal, and the second input signal.

The analog integrated circuit has a first and a second loading device. The first loading device has a first terminal connected to an inverted terminal of the differential pair of output terminals, a second terminal connected to a common mode voltage terminal, and a third terminal. A loading control voltage at the third terminal controls a loading on a voltage signal present at the inverted terminal by the first loading device. The second loading device has a first terminal connected to an non-inverted terminal of the differential pair of output terminals, a second terminal connected to the common mode voltage terminal, and a third terminal. The loading control voltage also at the third terminal controls the loading on a voltage signal present at the non-inverted terminal by the second loading device. The first and second loading devices in the preferred embodiment are MOS transistors of a second conductivity type and are biased by a loading device controller to operate in a linear operation region of the first and second loading devices.

The loading device controller within the analog integrated circuit compensates for changes in voltage level of the output signal due to variations in temperature and variations in manufacturing process within the function core circuit. The loading device controller has a loading control voltage terminal to provide the loading control voltage. The loading device controller has a first MOS transistor of a first conductivity type with a gate connected to a first control bias voltage source, a source connected to the ground reference point, and a drain. The loading device controller has a second MOS transistor of the first conductivity type with a source connected to the drain of the first MOS transistor of the first conductivity type, a gate, and a drain. A first MOS transistor of the second conductivity type has a source connected to the common mode voltage terminal, a drain connected to the second MOS transistor of the first conductivity type, and gate connected to the loading control voltage terminal. A first differential amplifier has an inverting input connected to a second control bias voltage source, a non-inverting input connected to the connection of the drain of the first MOS transistor of the second conductivity type and the drain of the second MOS transistor of the first conductivity type, and an output connected to the gate of the first MOS transistor of the second conductivity type and forms the loading control voltage terminal. The voltage present at the connection of the drain of the first MOS transistor of the second conductivity type and the drain of the second MOS transistor of the first conductivity type is maintained at a voltage level equal to a voltage level of the second bias control voltage source. A second differential amplifier has an inverting input connected to the connection of the drain of the first MOS transistor of the first conductivity type and the source of the second MOS transistor of the first conductivity type, a non-inverting input connected to a third biasing control voltage source, and an output connected to the gate of the second MOS transistor of the first conductivity type. The voltage at the connection of the drain of the first MOS transistor of the first conductivity type and the source of the second MOS transistor of the first conductivity type is maintained at the voltage level of the third biasing voltage source.

Further, the analog integrated core circuit has a biasing circuit. The biasing circuit has the common mode voltage terminal to provide a common mode voltage to the first and second loading devices and in communication with the compensation circuit provide the first, second and third control bias voltage sources.

The bias circuit includes a bandgap referenced current source. The bandgap referenced current source provides a reference current that is independent of temperature. A current mirror has a reference terminal that is responsive to the reference current source, a first terminal coupled to the compensation circuit to provide a first current proportional to the reference current and second terminal to provide a second current proportional to the reference current.

The bias circuit has a first resistor connected to the first terminal of the current mirror. A threshold voltage generator is connected between a second terminal of the first resistor and a ground reference point such that the first bias voltage source is provided to the first to the compensation circuit.

A voltage divider is connected between the second terminal of the current mirror and the ground reference point. The voltage divider has a first terminal to provide the second bias voltage source to the compensation circuit and a second terminal to provide a third bias voltage source to the compensation circuit. A voltage buffer has an input terminal that is in communication with the connection of the second terminal of the current mirror and the voltage divider. An output terminal is connected to the common mode voltage terminal to provide the common mode voltage source in response to a fourth biasing voltage present at the connection of the second terminal of the current mirror and the voltage divider.

If the analog integrated core circuit is a multiplier circuit, it has a first and a second parallel connected pair of MOS transistors of a first conductivity type. A gate of one MOS transistor of the first parallel connected pair of MOS transistors is connected to an inverting input of the first differential pair of input terminals. A gate of the other MOS transistor of the parallel connected MOS transistors is connected to a non-inverting input of the first differential pair of input terminals. Commonly connected drains are connected to the inverted terminal of the differential pair of output terminals. Likewise, gate of one MOS transistor of the second parallel connected pair of MOS transistors is connected to an inverting input of the second differential pair of input terminals. A gate of the other MOS transistor of the parallel connected MOS transistors is connected to a non-inverting input of the second differential pair of input terminals. Commonly connected drains are connected to the non-inverted terminal of the differential pair of output terminals. A first biasing constant current source is connected between a power supply voltage source and the commonly connected drains of the first parallel connected MOS transistors, and a second biasing constant current source is connected between commonly connected sources of the first parallel connected MOS transistors and a ground reference point. A third biasing constant current source is connected between a power supply voltage source and the commonly connected drains of the second parallel connected MOS transistors, and a fourth biasing constant current source is connected between commonly connected sources of the second parallel connected MOS transistors and a ground reference point.

BRIEF DESCRIPTION OF THE DRAWINGS

FIGS. 4a–4d are schematics of an analog function including a temperature and process compensation circuit and a voltage biasing circuit of this invention.

DETAILED DESCRIPTION OF THE INVENTION

Figure 4A:
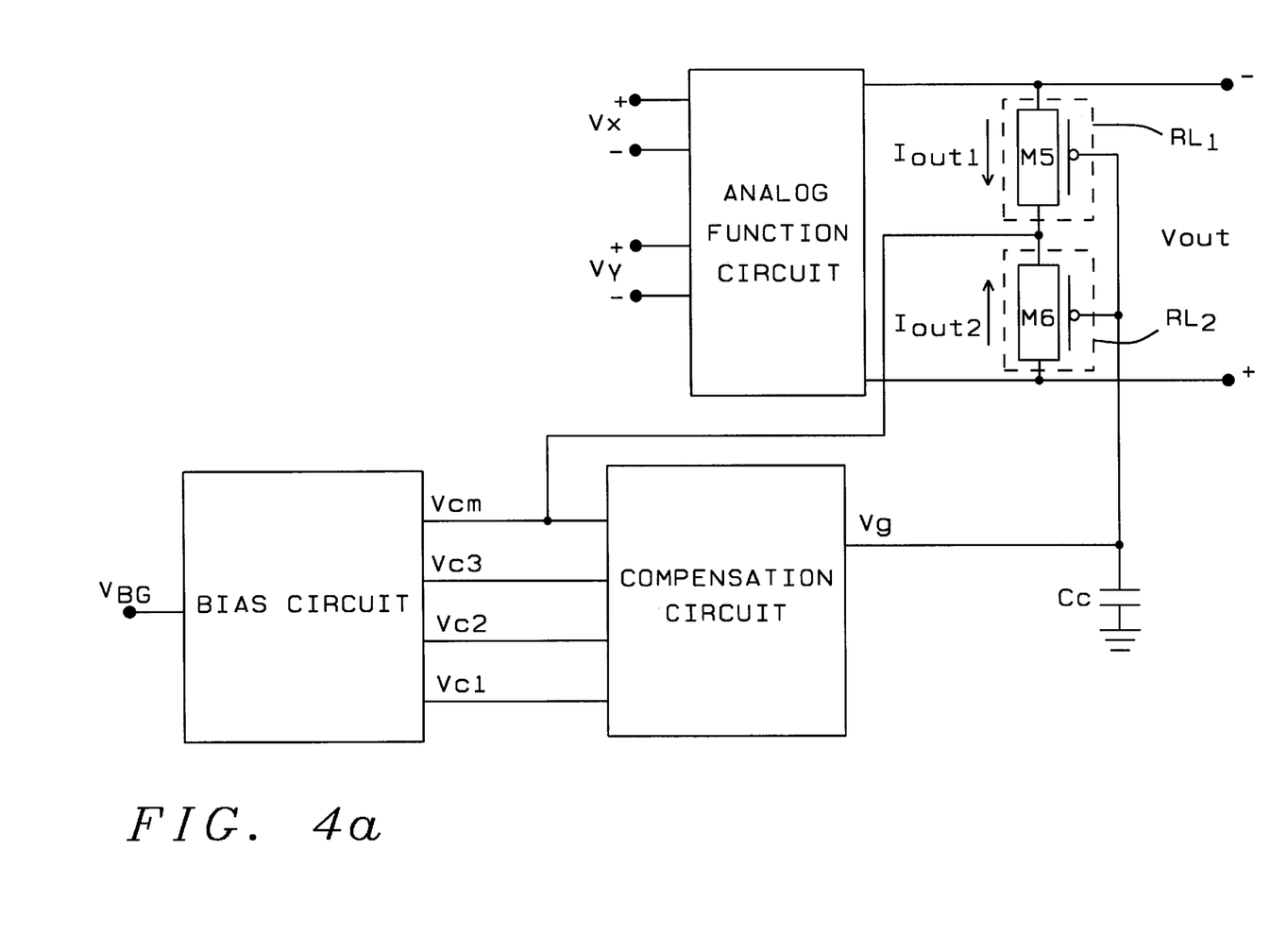

Refer now to FIG. 4a for a discussion of an analog integrated circuit of this invention. The analog function core circuit as described in FIG. 1, has two differential input signals v1 and v2 that are combined according to an arithmetic function to form a differential output voltage signal vout. The magnitude of the differential output voltage signal vout is shown in EQ. 1, above.

To develop the output voltage vout, the load resistors RL1 and RL2 of FIG. 4a are implemented as two p-type MOS transistors M5 and M6 configured to act as active load devices. The source of the active load device RL1 is connected to the inverted output (−) of the analog function core circuit and the drain is connected to the bias circuit to receive the common mode voltage Vcm. The gate is biased to a voltage level Vg, such that the active load device will operate in the linear region of the MOS device characteristics. The source of the active load device Rp2 is connected to the non-inverted output (+) of the analog function core circuit and the drain is connected to the bias circuit to receive the common mode voltage Vcm. The gate is also biased to a voltage level Vg, such that the active load device RL2 will also operate in the linear region of the MOS device characteristics.

If the analog function core circuit is implemented as the analog multiplier, as discussed above in FIG. 3, using n-type MOS transistors, as shown, the active load devices RL1 and RL2 are implemented as the p-type MOS transistors M5 and M6 to provide compensation for changes in the currents $I_{out}$ and $I_{out2}$ due to fluctuations in temperature and changes in fabrication process.

The resistance of the loading devices RL1 and RL2 can be shown to be:

$$RL1 = RL2 = \frac{1}{\mu_p C_{ox} \left(\frac{W}{L}\right)_p (v_g - v_{Tp})} \quad \text{Eq. 5}$$

where:
  $\mu_p$ is the mobility of the bulk doped semiconductor material that forms the channel of the p-type MOS transistors M5 and M6.
  $C_{ox}$ is the capacitance of the gate oxide of the p-type MOS transistors M5 and M6.

$$\left(\frac{W}{L}\right)$$

is the width-to-length ratio of the p-type MOS transistors M5 and M6.

$v_g$ is the voltage at the gate of the p-type MOS transistors M5 and M6.

$v_{Tp}$ is the threshold voltage of the p-type MOS transistors M5 and M6.

The compensation circuit has an output connected to the gates of the loading devices RL1 and RL2 to provide the biasing voltage Vg to maintain the loading devices in their linear operating region. The compensation circuit further has an input terminal connected to the bias circuit to receive the common mode voltage source Vcm.

Figure 4B:
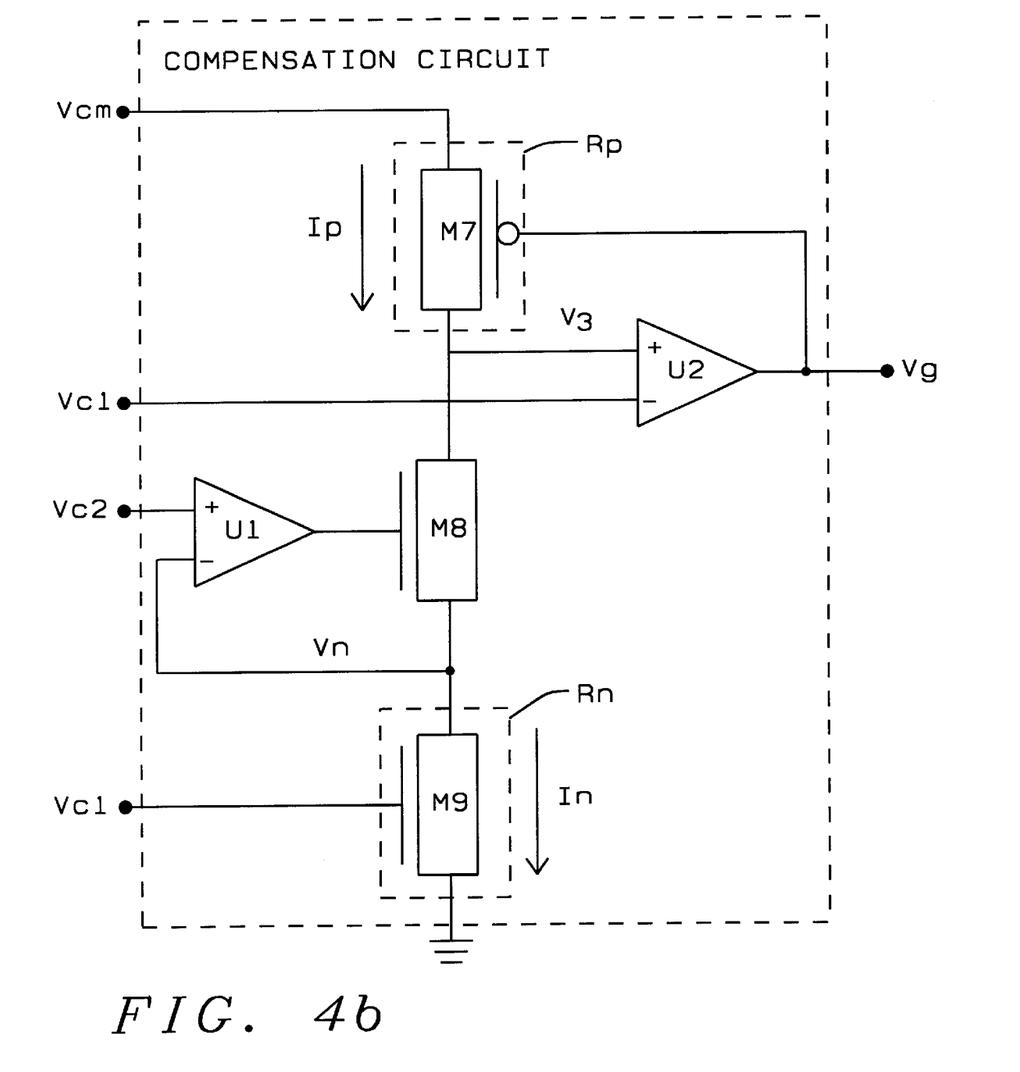

The compensation circuit, as shown in FIG. 4b, has a p-type MOS transistor M7 that acts as a third loading device Rp. The source of the third loading device Rp is connected to the bias circuit to receive the common mode voltage Vcm. The compensation circuit has a differential amplifier U2, with an output that provides the biasing voltage level Vg. The drain of the loading device Rp is connected to the non-inverting input (+) of the differential amplifier U2. The inverting input (−) of the differential amplifier U2 is connected to the biasing circuit that provides the a biasing voltage Vc3. The voltage level of the biasing voltage Vc3 is set between 100 mV and 200 mV lower than the desired voltage level of the common mode voltage Vcm.

The compensation circuit has an n-type MOS transistor M8 with its drain connected to the drain of the p-type loading device Rp. The compensation circuit further has a differential amplifier U1 with an output connected to the gate of the n-type MOS transistor M8.

The compensation circuit finally has an n-type MOS transistor M9 that acts as an n-type loading device Rn, with a drain connected to the source of the n-type MOS transistor M8 and the non-inverting input of the differential amplifier U1. The inverting input of the differential amplifier U1 is connected to the biasing circuit that provides a biasing voltage Vc2. The biasing voltage Vc2 is set to a voltage level of approximately 150 mV above the ground reference point. The source of the n-type loading device Rn is connected to the ground reference point. The gate of the n-type loading device Rn is connected to the bias circuit, which provides a biasing voltage Vc1.

The decoupling capacitor $C_c$ is connected between the output terminal of the compensation circuit that provides the biasing voltage level Vg and the ground reference point. The decoupling capacitor $C_c$ is sufficiently large to filter any high frequency noise present at the output terminal of the compensation circuit that provides the biasing voltage level Vg.

The biasing voltage level Vg at the output of the differential amplifier U2 forces the voltage level $V_3$ at the non-inverting input of the differential amplifier U2 to be set to the voltage level of the biasing voltage source Vc3. The current $I_p$ is then determined as:

$$I_p = \frac{Vcm - V_3}{Rp}$$

where:
$V_3$ is the voltage level at the source of the p-type loading device Rp and is equal to the voltage level of the biasing voltage Vc3.
$I_p$ is the current through the p-type loading device Rp.

Rp is the effective resistance of the p-type loading device M10 and is determined to be:

$$Rp = \frac{1}{\mu_p * C_{ox} * \left(\frac{W}{L}\right)_{p2} * (Vg - V_{Tp})}$$

where:
$\mu_p$ is the mobility of the p-type semiconductor material.

$C_{ox}$ is the capacitance of the gate oxide of the p-type loading device Rp.

$$\left(\frac{W}{L}\right)_{p2}$$

is the width to length ratio of the gate of the p-type loading device Rp.

$V_{TP}$ is the threshold voltage of the p-type loading device Rp.

As is apparent, the value of the current Ip is equal to the value of the current In through the n-type loading device Rn. The current In is determined as:

$$I_n = \frac{V_n}{Rn}$$

where:
$V_n$ is equal to the voltage level of the biasing voltage Vc2.

Rn is the resistance of the loading device and is determined as:

$$Rn = \frac{1}{\mu_n * C_{ox} * \left(\frac{W}{L}\right)_n * (Vc1 - V_{Tn})}$$

where:
$\mu_n$ is the mobility of the n-type semiconductor material.

$C_{ox}$ is the capacitance of the gate oxide of the p-type loading device Rn.

$$\left(\frac{W}{L}\right)_n$$

is the width to length ratio of the gate of the n-type loading device Rn.

$V_{Tn}$ is the threshold voltage of the n-type loading device Rn.

Therefore, the by setting the two currents Ip and In equal and solving for the voltage $Vg - V_{Tp}$ of FIG. 5 can be shown to equal:

$$Vg - V_{Tp} = \left[\frac{\mu_n}{\mu_p}\right]\left[\frac{\left(\frac{W}{L}\right)_{n2}}{\left(\frac{W}{L}\right)_{p2}}\right](Vc1 - V_{Tn})\frac{Vc2}{Vcm - Vc3}. \quad \text{Eq. 6}$$

The differential amplifier U2 will set the biasing voltage level Vg to the voltage necessary to force the voltage level $V_3$ to equal the voltage of the biasing voltage level Vc3.

By substituting Eq. 6 for the Vg–V$_{Tp}$ in Eq. 5 and then substituting Eq. 5 into Eq. 3 and Eq. 4, differential output voltage signal vout can be shown to equal:

$$Vout = \left[\frac{\left(\frac{W}{L}\right)_n \left(\frac{W}{L}\right)_{p2}}{\left(\frac{W}{L}\right)_p \left(\frac{W}{L}\right)_{n2}}\right] * \left[\frac{Vcm - Vc3}{(Vc1 - v_{tn})Vc2}\right] v_x * v_y$$

As is known in the art, the mobilities $\mu_p$ and $\mu_n$ are dependent on temperature thus the common mode voltage becomes insensitive to the effects of temperature. Also, any changes of the geometric and process dependent parameters $$\left(\left(\frac{W}{L}\right), V_T\right)$$

are cancelled. Thus any changes in the common mode voltage Vcm and the biasing voltage level Vg are compensated to correct any variations in the output voltage level vout of the multiplier core due to temperature and voltage. Further, the voltages Vcm, Vc1, Vc2, and Vc3 are constructed to be referenced to the bandgap of silicon to maintain their constant reference.

Figure 4C:
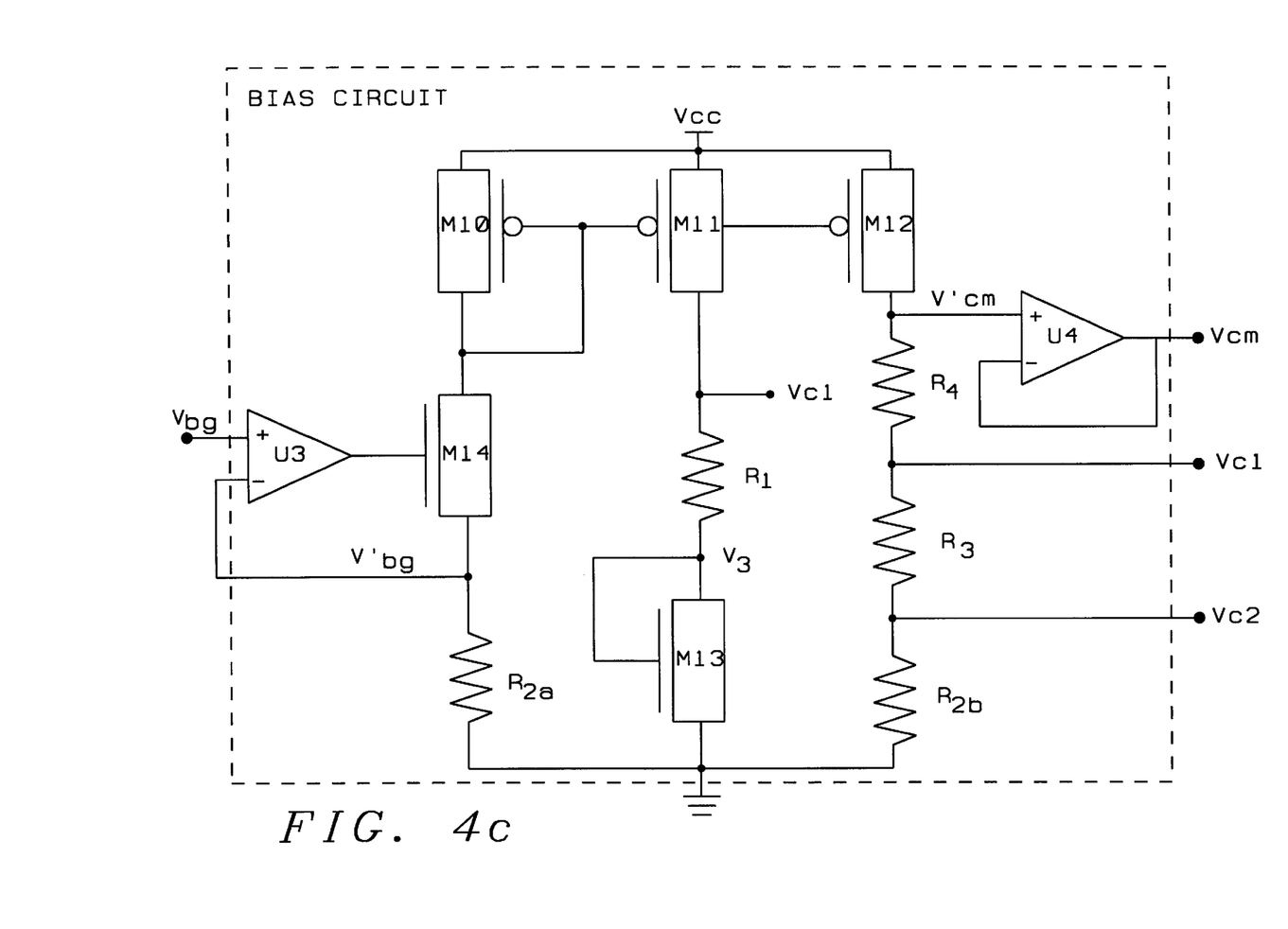

FIG. 4c illustrates the bias circuit of this invention that generates the voltages Vcm, Vc1, Vc2, and Vc3. The input of the bias circuit is a bandgap reference voltage source V$_{bg}$. The bandgap reference voltage source provides an accurate voltage source referenced to the bandgap voltage of the bulk semiconductor (silicon). The operational amplifier U3 and the MOS transistor M14 are configured such that the voltage V$_{bg2}$ at the source of the MOS transistor M14 is equal to the bandgap reference voltage V$_{bg}$. This insures that the current I$_{ref}$ flowing through the resistor R$_{2a}$ is constant.

The p-type MOS transistors M10, M11, and M12 are configured and designed as current mirrors. The currents I$_1$ and I$_2$ are proportional to the current I$_{ref}$ and the relative width-to-length ratios $$\left(\frac{W}{L}\right)$$

of the p-type MOS transistors M10, M11, and M12.

The n-type MOS transistor M13 has its gate and drain connected to form a diode. The current I$_1$ is set such that the drain-to-source voltage is the threshold voltage V$_T$ of the n-type MOS transistor M$_{13}$. The biasing voltage Vc1 is set at a voltage level of approximately the threshold voltage of the n-type loading device Rn2 plus a constant voltage V$_{const}$ and is equal to approximately 0.6V. The constant voltage V$_{const}$ is equal to the value of the resistor R$_3$ multiplied by the current I$_1$.

The common mode voltage V'cm is determined by the current I$_2$ flowing through the resistors R$_{2b}$, R$_3$, and R$_4$ and is equal to:

V'cm=I$_2$(R2b+R3+R4).

The operational amplifier U4 is configured as a unity gain buffer to prevent additional loading on the current I$_2$. The output of the operational amplifier U4 performs as the voltage source for the common mode voltage Vcm.

The biasing voltage Vc2 is determined by the current I$_2$ flowing through the resistor R$_{2b}$ and is found as:

Vc2=I2*R2b.

The biasing voltage Vc3 is determined by the current I$_2$ flowing through the resistor R$_{2b}$ and R$_3$ and is found as:

Vc3=I2*R2b+R3.

To those skilled in the art it will be apparent that a design incorporating n-type MOS load resistors for p-type MOS multipliers can be derived by reversing the roles of the loading devices Rp and Rn in the embodiment as shown in FIG. 4b above.

While this invention has been particularly shown and described with reference to the preferred embodiments thereof, it will be understood by those skilled in the art that various changes in form and details may be made without departing from the spirit and scope of the invention.

The invention claimed is:

1. A temperature and process independent analog integrated circuit comprising:

an analog function core responsive to a first differential input signal and a second differential input signal, and having first and second output terminals;

a first loading device having a first terminal responsive to the first output terminal, a second terminal responsive to a common mode voltage, and a first control terminal;

a second loading device having a third terminal responsive to the second output terminal, a fourth terminal responsive to the common mode voltage, and a second control terminal; and a compensation circuit in communication with said first and second control terminals, wherein said compensation circuit comprises:

a first MOS transistor having a first source in communication with the common mode voltage, a first drain, and a first gate in communication with the first and second control terminals; and a first differential amplifier having a first input in communication with a first bias voltage source, a second input in communication with the first drain, and an output in communication with the first gate and the first and second control terminals.

2. The analog integrated circuit of claim 1 wherein said analog function core is selected from the group consisting of multipliers, adaptive filters, function generators, modulators, and neural networks.

3. The analog integrated circuit of claim 1 wherein the analog integrated core circuit is a multiplier circuit comprising:

a first current source;

a second current source;

a first pair of first and second MOS transistors arranged in parallel having a gate of the first MOS transistor in communication with a first terminal of the first differential input signal, a gate of the second MOS transistor in communication with a second terminal of the first differential input signal, commonly connected first drains in communication with the first current source, and commonly connected first sources;

a second pair of third and fourth MOS transistors arranged in parallel having a gate of the third MOS transistor in communication with a first terminal of the second differential input signal, a gate of the fourth MOS transistor in communication with a second terminal of the second differential input signal, commonly connected second drains in communication with the second current source, and commonly connected second sources;

a third current source in communication with the commonly connected first sources to form the first output terminal; and a fourth current source in communication with the commonly connected second sources to form the second output terminal.

4. The analog integrated circuit of claim 1 wherein the first and second loading devices comprise MOS transistors.

5. The analog integrated circuit of claim 1 wherein said compensation circuit further comprises:
- a second MOS transistor having a second gate, a second drain in communication with the first drain and a second source;
- a third MOS transistor in communication with a second bias voltage source, a third source in communication with a reference point, and a third drain in communication with the second source; and
- a second differential amplifier having a second input in communication with the third drain and the second source, a third input in communication with a third bias voltage source, and an output in communication with the second gate.

6. The analog integrated circuit of claim 5 wherein the first MOS transistor and the first and second loading devices are of the first conductivity type and the second and third MOS transistors are of the second conductivity type.

7. The analog integrated circuit of claim 1 further comprising a biasing circuit to provide the common mode voltage to the first and second loading devices.

8. The analog integrated circuit of claim 5 further comprising a biasing circuit comprising:
- a common mode voltage source to provide the common mode voltage that is referenced to a semiconductor bandgap voltage;
- a first bias voltage source to provide a first bias voltage to the first MOS transistor that is referenced to the semiconductor bandgap voltage;
- a second bias voltage source to provide the second bias voltage to the second MOS transistor that is referenced to a semiconductor bandgap voltage; and
- a third bias voltage source to provide the third bias voltage to the third MOS transistor that is referenced to a semiconductor bandgap voltage.

9. The analog integrated circuit of claim 7 wherein the common mode voltage is substantially proportional to a semiconductor bandgap voltage.

10. A temperature and process independent analog multiplier circuit comprising:
- a multiplier core responsive to a first differential input signal and a second differential input signal, and having first and second output terminals;
- a first loading device having a first terminal responsive to the first output terminal, a second terminal responsive to a common mode voltage, and a first control terminal;
- a second loading device having a third terminal responsive to the second output terminal, a fourth terminal responsive to the common mode voltage, and a second control terminal; and
- a compensation circuit in communication with said first and second control terminals,
- wherein said compensation circuit comprises:
- a first MOS transistor having a first source in communication with the common mode voltage, a first drain, and a first gate in communication with the first and second control terminals; and
- a first differential amplifier having a first input in communication with a first bias voltage source, a second input in communication with the first drain, and an output in communication with the first gate and the first and second control terminals.

11. The temperature and process independent analog multiplier circuit of claim 10 wherein the multiplier core comprises:
- a first current source;
- a second current source;
- a first pair of first and second MOS transistors arranged in parallel having a gate of the first MOS transistor in communication with a first terminal of the first differential input signal, a gate of the second MOS transistor in communication with a second terminal of the first differential input signal, commonly connected first drains in communication with the first current source, and commonly connected first sources;
- a second pair of third and fourth MOS transistors arranged in parallel having a gate of the third MOS transistor in communication with a first terminal of the second differential input signal, a gate of the fourth MOS transistor in communication with a second terminal of the second differential input signal, commonly connected second drains in communication with the second current source, and commonly connected second sources;
- a third current source in communication with the commonly connected first sources to form the first output terminal; and
- a fourth current source in communication with the commonly connected second sources to form the second output terminal.

12. The analog multiplier circuit of claim 10 wherein the first and second loading devices comprises MOS transistors.

13. The analog multiplier circuit of claim 10 wherein said compensation circuit further comprises:
- a second MOS transistor having a second gate, a second drain in communication with the first drain and a second source;
- a third MOS transistor in communication with a second bias voltage source, a third source in communication with a reference point, and a third drain in communication with the second source; and
- a second differential amplifier having a second input in communication with the third drain and the second source, a third input in communication with a third bias voltage source, and an output in communication with the second gate.

14. The analog multiplier circuit of claim 13 wherein the first MOS transistor and the first and second loading devices are of the first conductivity type and the second and third MOS transistors are of the second conductivity type.

15. The analog multiplier circuit of claim 11 further comprising a biasing circuit to provide the common mode voltage to the first and second loading devices.

16. The analog multiplier circuit of claim 13 further comprising a biasing circuit comprising:
- a common mode voltage source to provide the common mode voltage that is referenced to a semiconductor bandgap voltage;
- a first bias voltage source to provide a first bias voltage to the first MOS transistor that is referenced to the semiconductor bandgap voltage;
- a second bias voltage source to provide a second bias voltage to the second MOS transistor that is referenced to a semiconductor bandgap voltage; and
- a third bias voltage source to provide a third bias voltage to the third MOS transistor that is referenced to a semiconductor bandgap voltage.

17. The analog multiplier circuit of claim 15 wherein the common mode voltage is substantially proportional to a semiconductor bandgap voltage.

18. A temperature and process compensation circuit in communication with control terminals of an active load of an analog integrated circuit to counteract changes in an output level of said analog integrated circuit due to temperature and manufacturing process, said compensation circuit comprising:

a first MOS transistor having a first source in communication with a common mode voltage, a first drain, and a first gate in communication with the control terminals;

a first differential amplifier having a first input in communication with a first bias voltage, a second input in communication with the first drain, and an output in communication with the control terminals;

a second MOS transistor having a second gate, a second drain in communication with the first drain and a second source;

a third MOS transistor having a third gate in communication with a second bias voltage, a third source in communication with a reference point, and a third drain in communication with the second source; and a second differential amplifier having a second input in communication with the third drain and the second source, a third input in communication with a third bias voltage, and an output in communication with the second gate.

19. The temperature and process compensation circuit of claim 18 wherein the first MOS transistor is of the first conductivity type and the second and third MOS transistors are of the second conductivity type.

20. The temperature and process compensation circuit of claim 18 further comprising a biasing circuit to provide the common mode voltage and to provide the first bias voltage, second bias voltage, and third bias voltage to said compensation circuit.

21. The temperature and process compensation circuit of claim 20 further comprising a biasing circuit comprising:

a common mode voltage source to provide the common mode voltage that is referenced to a semiconductor bandgap voltage;

a first bias voltage source to provide a first bias voltage to the first MOS transistor that is referenced to the semiconductor bandgap voltage;

a second bias voltage source to provide a second bias voltage to the second MOS transistor that is referenced to a semiconductor bandgap voltage; and a third bias voltage source to provide a third bias voltage to the third MOS transistor that is referenced to a semiconductor bandgap voltage.

22. A temperature and process independent analog integrated circuit comprising:

analog integrated function means for providing first and second output signals responsive to a first differential input signal and a second differential input;

first loading means for providing an output voltage in response to the first output signal, a common mode voltage signal, and a compensation control signal;

second loading means for providing an output voltage in response to the second output signal, the common mode voltage signal, and the compensation control signal; and compensation circuit for generating the compensation control signal to compensate for changes due to temperature and manufacturing variations.

23. The analog integrated circuit of claim 22 wherein said analog integrated function means is selected from the group consisting of multipliers, adaptive filters, function generators, modulators, and neural networks.

24. The analog integrated circuit of claim 22 wherein the analog integrated function means is a multiplier circuit comprising:

first current means for supplying a first current;

second current means for supplying a second current;

a first pair of first and second MOS transistors arranged in parallel having a gate of the first MOS transistor in communication with a first terminal of the first differential input signal, a gate of the second MOS transistor in communication with a second terminal of the first differential input signal, commonly connected first drains responsive to the first current, and commonly connected first sources;

a second pair of third and fourth MOS transistors arranged in parallel having a gate of the third MOS transistor in communication with a first terminal of the second differential input signal, a gate of the fourth MOS transistor in communication with a second terminal of the second differential input signal, commonly connected second drains responsive to the second current, and commonly connected second sources;

third current means for supplying a third current and in communication with the commonly connected first sources to form the first output terminal; and fourth current means for supplying a third current and in communication with the commonly connected second sources to form the second output terminal.

25. The analog integrated circuit of claim 22 wherein the first and second loading means comprise MOS transistors.

26. The analog integrated circuit of claim 22 wherein said compensation means comprises:

a first MOS transistor having a first source in communication with the common mode voltage, a first drain, and a first gate; and first differential amplifier means for differentially amplifying a first bias voltage source and a signal from the first drain, wherein an output of the first differential amplifier means and a signal from the first gate form the compensation control signal.

27. The analog integrated circuit of claim 26 wherein said compensation means further comprises:

a second MOS transistor having a second gate, a second drain in communication with the first drain and a second source;

a third MOS transistor in communication with a second bias voltage source, a third source in communication with a reference point, and a third drain in communication with the second source; and second differential amplifier means for amplifying as a first input the third drain and the second source, and as a second input a third bias voltage source, and to provide output to the second gate.

28. The analog integrated circuit of claim 27 wherein the first MOS transistor and the first and second loading devices are of the first conductivity type and the second and third MOS transistors are of the second conductivity type.

29. The analog integrated circuit of claim 22 further comprising biasing means to provide the common mode voltage to the first and second loading means.

30. The analog integrated circuit of claim 27 further comprising a biasing circuit comprising:

means for generating the common mode voltage that is referenced to a semiconductor bandgap voltage;

means for providing a first bias voltage that is referenced to the semiconductor bandgap voltage;

means for providing a second bias voltage that is referenced to a semiconductor bandgap voltage; and means for providing a third bias voltage that is referenced to a semiconductor bandgap voltage.

31. The analog integrated circuit of claim 29 wherein the common mode voltage is substantially proportional to a semiconductor bandgap voltage.

32. A temperature and process independent analog multiplier circuit comprising:

multiplier means for multiplying a first differential input signal and a second differential input to provide first and second output signals;

first loading means for providing an output voltage in response to the first output signal, a common mode voltage signal, and a compensation control signal;

second loading means for providing an output voltage in response to the second output signal, the common mode voltage signal, and the compensation control signal; and compensation circuit for generating the compensation control signal to compensate for changes due to temperature and manufacturing variations.

33. The temperature and process independent analog multiplier circuit of claim 32 wherein the multiplier means comprises:

first current means for supplying a first current;

second current means for supplying a second current;

a first pair of first and second MOS transistors arranged in parallel having a gate of the first MOS transistor in communication with a first terminal of the first differential input signal, a gate of the second MOS transistor in communication with a second terminal of the first differential input signal, commonly connected first drains responsive to the first current, and commonly connected first sources;

a second pair of third and fourth MOS transistors arranged in parallel having a gate of the third MOS transistor in communication with a first terminal of the second differential input signal, a gate of the fourth MOS transistor in communication with a second terminal of the second differential input signal, commonly connected second drains responsive to the second current, and commonly connected second sources;

third current means for supplying a third current and in communication with the commonly connected first sources to form the first output terminal; and fourth current means for supplying a third current and in communication with the commonly connected second sources to form the second output terminal.

34. The temperature and process independent analog multiplier circuit of claim 32 wherein the first and second loading devices comprises MOS transistors.

35. The temperature and process independent analog multiplier circuit of claim 32 wherein said compensation means comprises:

a first MOS transistor having a first source in communication with the common mode voltage, a first drain, and a first gate; and first differential amplifier means for differentially amplifying a first bias voltage source and a signal from the first drain, and an output, wherein the output of the first differential amplifier means and a signal from the first gate form the compensation control signal.

36. The temperature and process independent analog multiplier circuit of claim 35 wherein said compensation means further comprises:

a second MOS transistor having a second gate, a second drain in communication with the first drain and a second source;

a third MOS transistor in communication with a second bias voltage source, a third source in communication with a reference point, and a third drain in communication with the second source; and a second differential amplifier means for amplifying as a first input the third drain and the second source, and as a second input a third bias voltage source, and to provide output to the second gate.

37. The temperature and process independent analog multiplier circuit of claim 32 wherein the first MOS transistor and the first and second loading devices are of the first conductivity type and the second and third MOS transistors are of the second conductivity type.

38. The temperature and process independent analog multiplier circuit of claim 35 further comprising biasing means for providing a common mode voltage to the first and second loading.

39. The temperature and process independent analog multiplier circuit of claim 37 further comprising biasing means comprising:

means to generate the common mode voltage that is referenced to a semiconductor bandgap voltage;

means for providing a first bias voltage that is referenced to the semiconductor bandgap voltage;

means for providing a second bias voltage that is referenced to a semiconductor bandgap voltage; and means for providing a third bias voltage that is referenced to a semiconductor bandgap voltage.

40. The analog integrated circuit of claim 38 wherein the common mode voltage is substantially proportional to a semiconductor bandgap voltage.

41. A temperature and process compensation circuit in communication with control terminals of an active load of an analog integrated circuit to counteract changes in an output level of said analog integrated circuit due to temperature and manufacturing process, said compensation circuit comprising:

a first MOS transistor having a first source in communication with a common mode voltage, a first drain, and a first gate; and first differential amplifier means for differentially amplifying a first bias voltage source and a signal from the first drain, and an output, wherein the output of the first differential amplifier means and a signal from the first gate form a compensation control signal;

a second MOS transistor having a second gate, a second drain in communication with the first drain and a second source;

a third MOS transistor in communication with a second bias voltage source, a third source in communication with a reference point, and a third drain in communication with the second source; and a second differential amplifier means for amplifying as a first input the third drain and the second source, and as a second input a third bias voltage source, and to provide output to the second gate.

42. The compensation circuit of claim 41 wherein the first MOS transistor is of the first conductivity type and the second and third MOS transistors are of the second conductivity type.

43. The compensation circuit of claim 41 further comprising biasing means to provide the common mode voltage and to provide the first bias voltage source, second bias voltage source, and third bias voltage source to said compensation circuit.

44. The compensation circuit of claim 43 wherein said biasing means comprises:

means to generate the common mode voltage that is referenced to a semiconductor bandgap voltage;

means to generate a first bias voltage that is referenced to the semiconductor bandgap voltage;

means to generate the second bias voltage circuit that is referenced to the semiconductor bandgap voltage; and means to generate the third bias voltage that is referenced to the semiconductor bandgap voltage.

\* \* \* \* \*